United States Patent
Yesinowski et al.

[11] Patent Number: 5,886,525
[45] Date of Patent: Mar. 23, 1999

[54] APPARATUS AND METHOD FOR PERFORMING NMR SPECTROSCOPY ON SOLID SAMPLE BY ROTATION

[75] Inventors: James Paul Yesinowski, Fort Washington, Md.; Edward A. Hill, Alexandria, Va.

[73] Assignee: The United States of America as represented by the Secretary of the Navy, Washington, D.C.

[21] Appl. No.: 822,138

[22] Filed: Mar. 17, 1997

[51] Int. Cl.⁶ .................................................. G01R 33/48
[52] U.S. Cl. ............................................ 324/321; 324/307
[58] Field of Search ................................ 324/300–307, 324/312, 318, 321

[56] References Cited

U.S. PATENT DOCUMENTS

| | | | |
|---|---|---|---|
| 4,170,714 | 10/1979 | Weitekamp et al. . | |
| 4,201,941 | 5/1980 | Fyfe et al. | 324/321 |
| 4,710,714 | 12/1987 | Weitekamp et al. | 324/307 |
| 4,806,868 | 2/1989 | Schulke | 324/321 |
| 4,899,111 | 2/1990 | Pines et al. . | |
| 4,968,939 | 11/1990 | Pines et al. . | |
| 5,170,120 | 12/1992 | Barbara et al. | 324/307 |
| 5,229,722 | 7/1993 | Rommel et al. | 324/307 |
| 5,262,727 | 11/1993 | Behbin et al. . | |
| 5,333,994 | 8/1994 | Doty et al. . | |
| 5,469,061 | 11/1995 | Linehan et al. | 324/321 |
| 5,644,235 | 7/1997 | Balstusis | 324/321 |

OTHER PUBLICATIONS

Daniel A. C., Temperature Dependence of Spin–Lattice Relaxation of I127 in Pure Quadrupole Resonance, Printed in Nuclear Magnetic Resonance in Solids pp. 228–234 (edited by Lieven Van Gerven), 1965.

Kaye et al. Tables of Pysical and Chemical Constants and some Mathematical Functions, pp. 243, 1986.

*Primary Examiner*—John Barlow
*Assistant Examiner*—Craig Steven Miller
*Attorney, Agent, or Firm*—Thomas E. McDonnell; Barry A. Edelberg

[57] ABSTRACT

Nuclear magnetic resonance analysis of powdery or other randomly oriented solid samples is improved by slowly rotating the sample with a period exceeding the nuclear spin relaxation time of nuclei in the sample. As a result, a relatively large proportion of the crystallites in the sample are brought into resonance, thereby improving the signal to noise ratio of the NMR reading. In addition, information about the width of the entire spectrum can be obtained from analysis of measurements of only a portion of it.

21 Claims, 8 Drawing Sheets

APPARATUS AND METHOD FOR PERFORMING NMR SPECTROSCOPY ON SOLID SAMPLE BY ROTATION

The present invention relates to nuclear magnetic resonance (NMR) spectroscopy, and, more particularly, nuclear magnetic resonance spectroscopy of solid samples.

BACKGROUND OF INVENTION

Some nuclei possess angular momentum or spin and can be thought of as tiny spinning particles. Bearing charges, the spinning nuclei produce a magnetic moment, or a field, that is similar to that created by a microscopic bar magnet. When placed in a steady external magnetic field, the net magnetic moments of a collection of such nuclei attempt to line up with the magnetic field. Some nuclei align themselves parallel to the magnetic field $B_0$ while others align themselves antiparallel to the magnetic field $B_0$. These two different orientations have different energies. The number of nuclei in the high and low energy states at equilibrium follows a Boltzman distribution, the population difference being inversely related to the energy difference between the two stales. At equilibrium, more nuclei will be in the low energy state than in the high energy state. The individual magnetic dipoles, however, cannot line up with the external magnetic field, but rather are tilted at an angle to the magnetic field. Tilted at an angle, the dipoles will precess at an angle about the imposed magnetic field axis at a particular frequency, known as the Larmor frequency. The Larmor frequency ($f_0$) is related to the magnetic field $B_0$ at the nucleus by the equation $f_0 = \gamma B_0 / 2\pi$, where $\gamma$, a constant, is the magnetogyric ratio of each nuclear species.

If external electromagnetic radiation (typically pulses in the radio frequency ("rf") range) is applied to the nuclei at the Larmor frequency, a resonance occurs, whereby the rf energy is absorbed due to the excess spin population of nuclei in the low energy state, causing the magnetic moments in the lower energy state (for example parallel) to flip to the higher energy state (for example antiparallel). Depending on the duration of the rf pulse in pulsed NMR, the populations of the two levels will be perturbed from the equilibrium populations, and may become equal (90° pulse) or even inverted (180° pulse). When the pulsed irradiation ceases, the precession of magnetic moments can be detected by a receiver coil. The populations of parallel and antiparallel nuclei return to an equilibrium state with a characteristic time period $T_1$, also known as the nuclear spin-lattice or longitudinal relaxation time.

Different nuclei precess at different frequencies and, therefore, at a particular magnetic field strength, the nuclei will generally absorb energy at certain characteristic radio frequencies. Also, nuclei of the same nuclear species will absorb energy at slightly different frequencies, depending upon their molecular environment. Further, if the sample is a solid, the crystallographic orientation of the sample (the position of the crystal axes, or molecular axes for non-crystalline materials, relative to a magnetic field) can also affect the frequency of absorption.

In liquid samples, highly accurate NMR absorption frequencies can be determined due to the random tumbling and rapid reorientation of sample molecules in solution, This rapid reorientation effectively causes the surroundings of the resonating nuclei to appear isotropic on the time scale of the NMR experiment, and sharp absorption peaks can be obtained.

If polycrystalline, powdery, glassy, amorphous, sintered, or other solids in which the axes of individual chemical bonds in the sample are oriented at random are studied, however, observable peaks or lines are generally broadened due to different orientations of the axes with respect to the external magnetic field $B_0$. That is, the crystallites in a powder, for example, may be arranged randomly such that only a small number of axes have an orientation with a corresponding resonance frequency matching the input radio frequency, i.e., only a small number may be brought into resonance for any particular radio frequency. Even when so-called "pulsed" Fourier-transform (FT) methods are used, only a limited frequency range can be excited and observed in many cases of practical interest, such as 14N NMR.

In such situations, one way to help eliminate the sensitivity loss due to reduced numbers of resonating nuclei is to repeatedly scan the sample and add the results of each scan. As an increasing number of scans are added the signal portion of the summed scans increases more rapidly than the noise. This is because the signal increases linearly with the number of scans, while the noise increases proportionally to the square root of the number of scans. Thus, as more and more scans are added, absorption peaks can be discerned with a signal-to-noise ratio increasing as the square root of the number of scans.

The principal drawback with this approach is that the user must wait a time period comparable to the spin-lattice relaxation time of the sample before performing another scan in order to obtain the sensitivity advantage from multiple scan acquisitions. For spin-lattice relaxation times on the order of minutes, the amount of time required to acquire the requisite number of scans can be inordinately long. (Of course, the times depend on a number of factors, including, but not limited to nucleus, type of solid samples, and magnetic field strength of spectrometer.)

A second difficulty in applying NMR spectroscopy to such samples (hereafter referred to as "crystallites," although the samples may be amorphous, glassy, disordered, sintered, etc.) in the regime where the rf irradiation is sufficient only to observe a portion of the entire spectrum at one time is that one often wishes to know the appearance of the entire spectrum. This appearance is affected by the magnitude of the orientation dependent NMR interaction parameters. If the external magnetic field strength is fixed, the rf frequency must be changed in a multitude of relatively small steps. The probe may also need to be returned before acquiring multiple scans at each frequency, resulting in a time-consuming procedure that is difficult to automate,

SUMMARY OF THE INVENTION

In accordance with the present invention, the NMR sample is rotated, typically slowly relative to the spin-lattice relaxation time $T_1$, The axis of rotation may be perpendicular to the external magnetic field $B_0$, or at some other angle other than 0° (parallel). As a result, the NMR absorption of many powdery, polycrystalline, and other solid samples may be obtained in a shorter time interval than would otherwise be possible.

The present invention also allows measurements of anisotropic spin-Hamiltonian parameters, the nuclear quadrupole coupling constant (NQCC), for example, by a slow continuous rotation of the sample that changes the orientation of the principal-axis systems of interaction tensors with respect to the external magnetic field and renders the spin Hamiltonian time dependent. As a consequence, a conventional Hahn spin-echo pulse sequence yields imperfect refocusing and altered echo amplitudes. One advantage is that only a small portion of the entire powder pattern need be observed at a single frequency and that anisotropic interactions can be distinguished from distributions of isotropic interactions. Theoretical simulations of the echo amplitude as a function of the pulse interval for an axially-symmetric second-rank tensor can be compared to an analytical approximation derived in terms of the zeroth-order Bessel function. It is also possible to use a simple graphical method to obtain the NQCC values from the data.

Additional advantages of the invention will be set forth in part in the description which follows, and in part will be obvious from the description, or may be learned by practice of the invention. The advantages of the invention will be realized and attained by means of the elements and combinations particularly pointed out in the appended claims In accordance with the present invention, as embodied and broadly described herein, the invention comprises an apparatus for analyzing a solid sample using nuclear magnetic resonance. The apparatus comprises a source generating a magnetic field, and a support member holding the sample in the magnetic field. A drive mechanism is further provided for rotating the support member at a period T, which may be, but is not necessarily, greater than a nuclear spin-lattice relaxation time of the nuclei of atoms in the sample being observed.

Further, in accordance with the present invention, a method is provided for measuring an NMR spectrum of a solid sample that includes a plurality of atoms, the atoms having nuclear spin relaxation times that may or may not be different. The method comprises the steps of: placing the solid sample in a magnetic field; subjecting the solid sample to a series of pulses of a first electromagnetic radiation; detecting a second electromagnetic radiation emitted from the solid sample in response to the pulses; and rotating the solid sample with a predetermined time period, the time period being related to the spin-lattice relaxation time of the nuclei being observed in the sample.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts In accordance with the present invention, a much larger proportion of the crystallites in a solid sample can be brought into resonance compared to that achieved by the prior art, The resulting increased sensitivity is achieved by the increased rate at which measurements can be made on the sample. As discussed in greater detail below, individual acquisitions (i.e., applications of rf pulses to the sample and detection of the precessing magnetic moments) are added together to yield a signal-to-noise ratio that increases as the square root of the number of scans, Typically, the sample is in the form of a tightly-packed powder and is rotated slowly about an axis perpendicular to the main magnetic field $B_0$. However, other rotational schemes involving loosely-packed (tumbling powders), and other combinations of slow mechanical motions about various axes are within the scope of the present invention.

Figure 1:
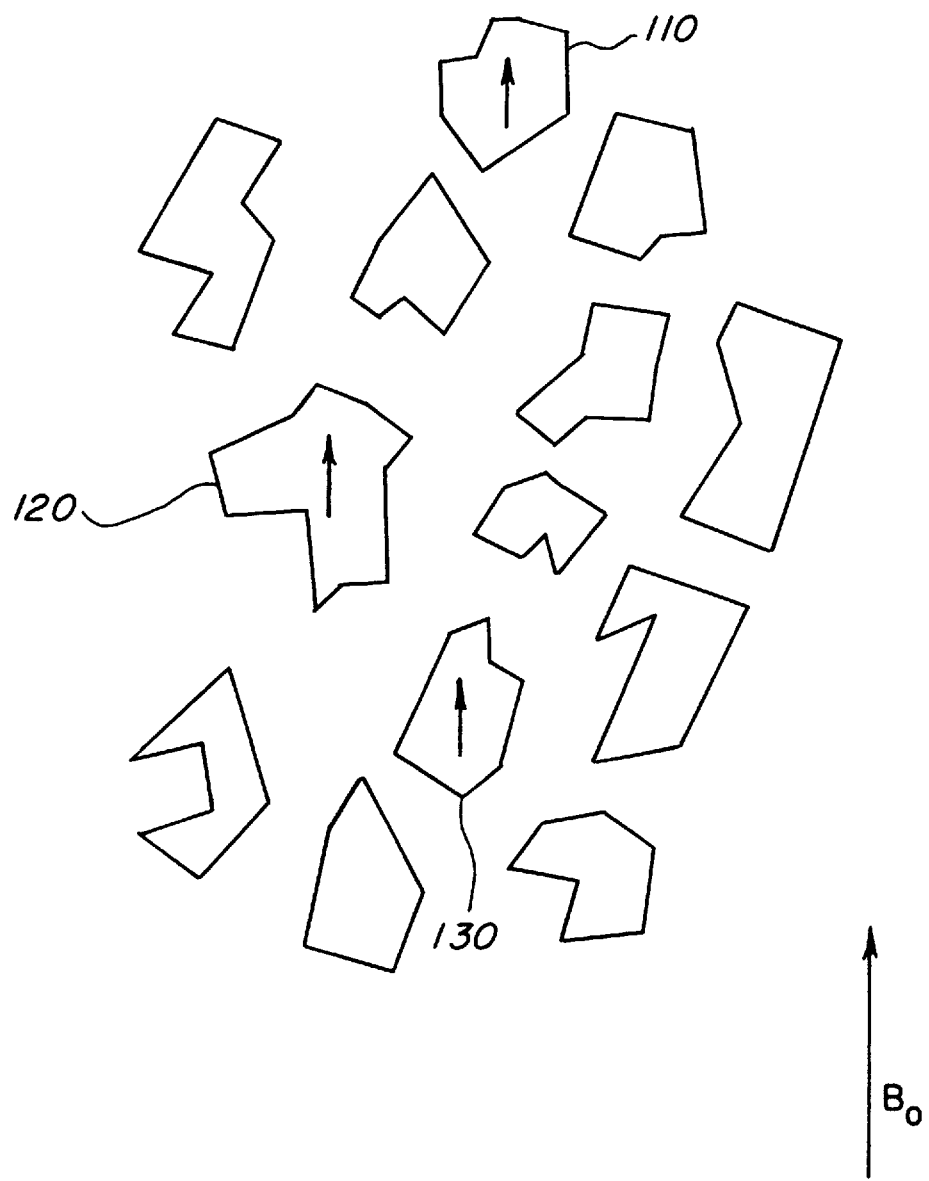
FIG. 1 illustrates an enlarged view of a crystalline powder to be analyzed using NMR in accordance with the present invention.
Figure 2:
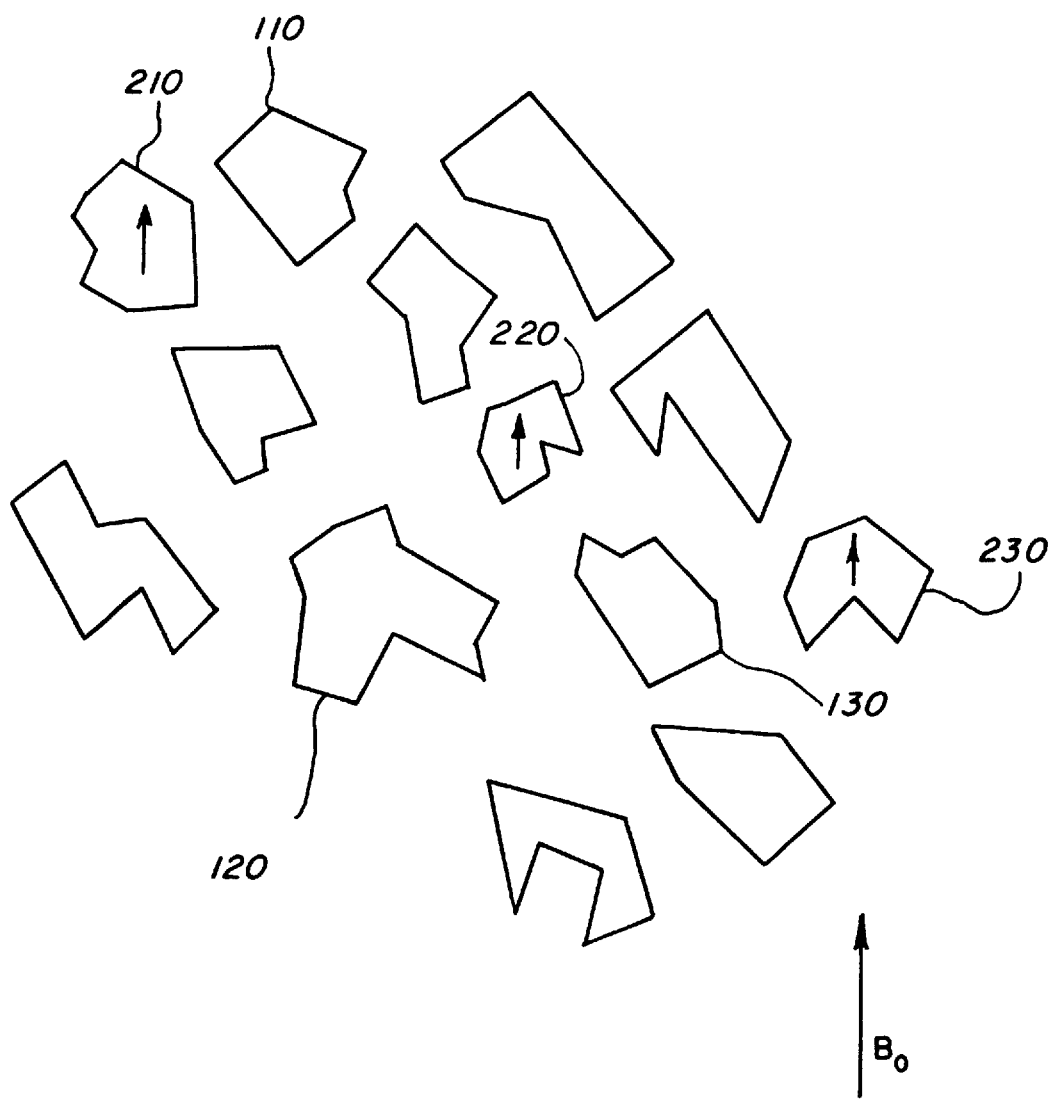
FIG. 2 illustrates the crystalline powder shown in FIG. 1 after rotation.

The present invention will be further described in accordance with FIGS. 1 and 2. As seen in FIG. 1 when a sample 100 containing crystallites is placed in a fixed magnetic field $B_0$ indicated by arrow 105, only a small number of crystallites, as represented in FIG. 1 by crystallites 110, 120, and 130 (with arrows pointing up in general alignment with magnetic field $B_0$; these arrows represent schematically the three axes of an orientation-dependent NMR interaction, such that resonance is achieved when the single arrow is pointed in the direction of the magnetic field) have nuclei at the desired resonance frequency which can be detected by applying a corresponding input radio frequency. These crystallites are thus in an orientation such that their nuclei can absorb rf energy resonantly and be detected. Once this occurs, however, the nuclei must undergo spin-lattice relaxation before their absorption can be detected again.

If the sample is rotated about an axis different from the magnetic field $B_0$, new crystallites, as represented by crystallites 210, 220, and 230 in FIG. 2, are now oriented such that they contain nuclei that will respond to rf irradiation. Previously resonating nuclei in crystallites 110, 120, and 130 as shown in FIG. 1, however, cannot be brought into resonance in the rotated position of FIG. 2 because crystallites 110, 120, and 130 are no longer oriented in such a way that the resonance frequencies of their nuclei match the frequency of input rf energy. Thus, upon rotating the sample, the nuclei of crystallites 110, 120 and 130 undergo spin-lattice relaxation, while crystallites 210, 220 and 230 are brought into resonance. The process of rotating new crystallites into a position of resonance can be repeated as the sample rotates. Moreover, provided that the period of rotation is comparable to or longer than the spin-lattice relaxation time, nuclei which were previously brought into resonance will be capable of absorbing rf energy again (i.e., will be in a non-saturated condition) as the sample rotates back to the resonating position for those nuclei.

Thus, in accordance with the present invention, rather than taking successive measurements of a sample at a given resonance position and waiting for the nuclei to undergo relaxation after each measurement, the sample is rotated, such that nuclei are continuously being brought into resonance while others undergo relaxation. Consequently, the rate at which successive NMR measurements can be made is significantly increased.

While the period of rotation could be equal to or greater than the spin-lattice relaxation time of the nuclei under observation, the most preferable period is at least 2.5 times the spin-lattice relaxation time of the nuclei under observation, Moreover, the input radio frequency can be applied continuously (continuous-wave or CW NMR) or as pulses to the sample. Typically, if pulses are used, the delay D between successive pulses preferably satisfies the following approximate formula:

$$D = \frac{\Delta f2 \times T}{\Delta f1} \quad (1)$$

where $\Delta f1$ is the entire range of frequencies over which the nuclei of the sample are capable of resonating, $\Delta f2$ is the range of frequencies excited by the rf pulses during the scan, and T is the period of rotation of the sample. A detailed description of the NMR apparatus in accordance with the present invention will now be presented with reference to FIG. 3.

Figure 3:
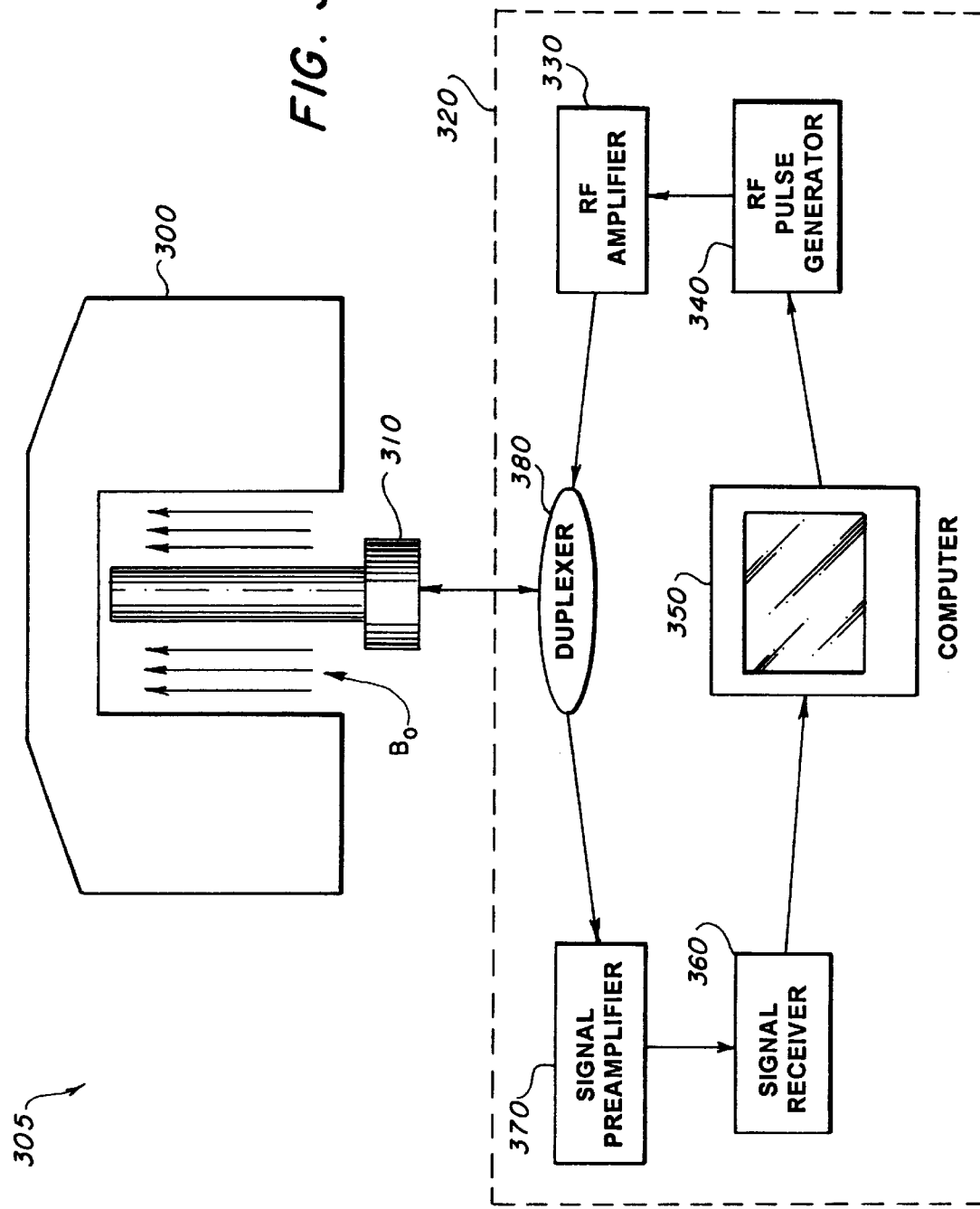
FIG. 3 is a schematic view of a NMR spectrometer, probe, and magnet in accordance with the present invention.

As shown in FIG. 3, the NMR, apparatus 305 includes a spectrometer 320, such as the Bruker MSL-300 spectrometer, coupled to a probe 310 containing the sample 410 (shown in FIG. 4), which in turn is disposed in a magnetic field $B_0$ generated by magnet 300. Spectrometer 320 includes a computer 350 for controlling the generation of rf pulses in a precisely-timed sequence, for example, and for processing of NMR data A user inputs parameters defining the rf pulses to computer 350, which outputs corresponding control signals to rf pulse generator 340. In response to these control signals, rf pulse generator 340 supplies rf pulses that are amplified by rf amplifier 330. The amplified pulses are then supplied to a coil 420 (see FIG. 4) in probe 310 through duplexer 380.

The pulses cause the sample 100 to emit rf data signals detected by coil 420, which are routed to signal preamplifier 370 for preliminary amplification. The signals are then amplified further and suitably processed by signal receiver 360. Computer 350 then receives, processes, and displays the signals as NMR output data.

Figure 4:
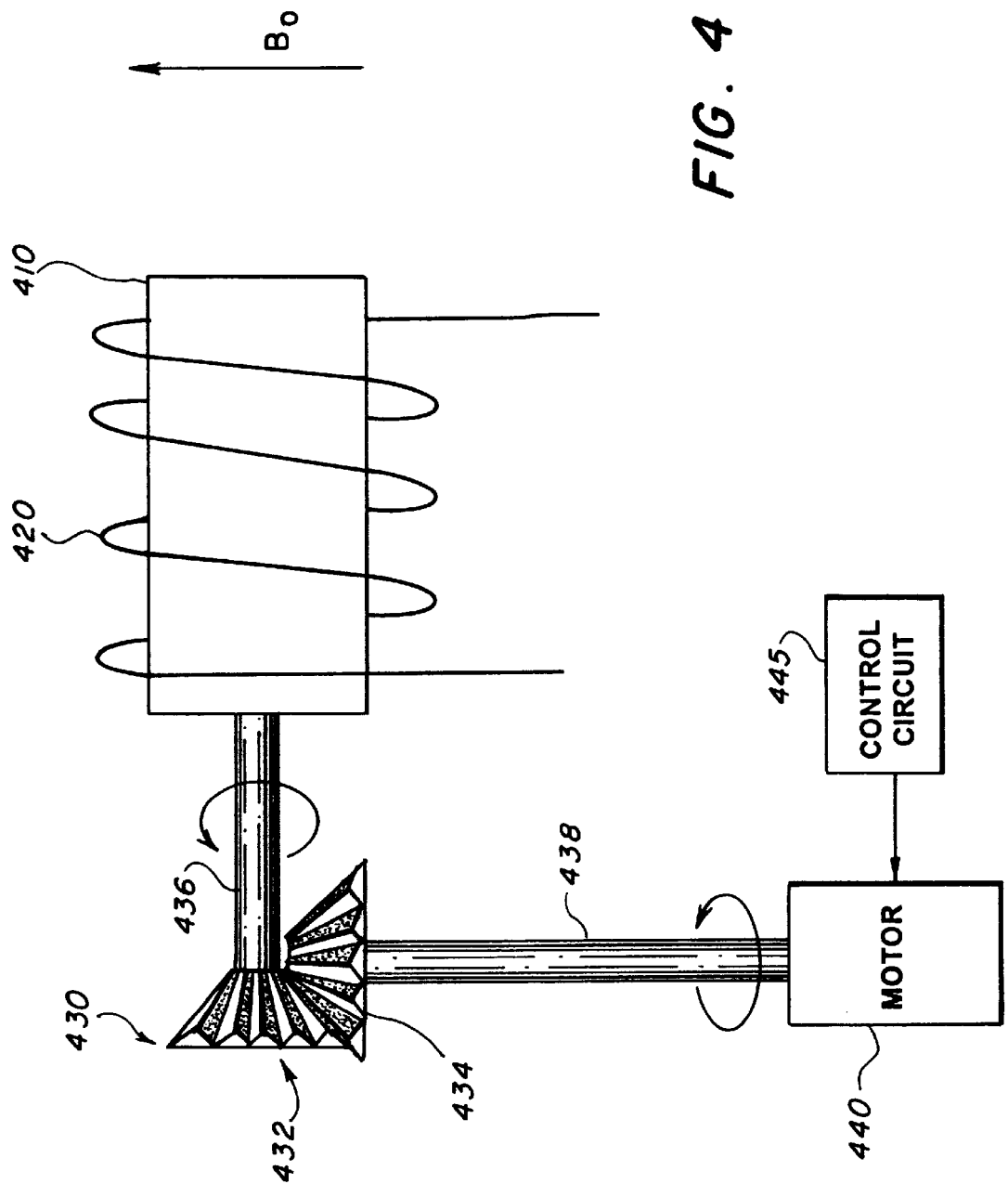
FIG. 4 is an enlarged schematic view of part of the probe in accordance with the present invention.

As described below, probe 310 generates rf radiation to irradiate the sample, as well as detects radiation emitted by the sample. Probe 310 is typically tuned and, if desired, impedance-matched to the chosen observation frequency typically in the range of 5–750 MHz. If the sample is scanned in a step-wise fashion, it is necessary for probe 310 to be tuneable over the entire frequency range, although this may be done manually. FIG. 4 shows an enlarged top portion of probe 310, which includes sample holder 410 disposed within coil 420. Typically, sample holder 410 is a cylindrical container made of material transparent to radiation at radio frequencies used for the samples and has a diameter of, for example, 3 centimeters However, containers having other sizes and shapes are possible, including larger sizes, because the homogeneity of the magnetic field throughout sample 100 is not as important as in normal NMR experiments. As further shown in FIG. 4, a gear assembly 430, including first and second beveled gears 432 and 434, is coupled to rotate a shaft 436 at the desired period of rotation T. Gear assembly 430 transmits rotary motion of motor 440 to sample holder 410. Motor 440 is typically an AC drive motor, the speed of which can be adjusted by a control circuit 445. Motor 440 can also be controlled by computer 350.

Other schemes for rotating holder 410 are contemplated, such as pulleys and air drives, as alternatives to the motor and gear assemblies of FIG. 4. As indicated above, the rotation period should exceed the spin-lattice relaxation time of the nuclei under observation, and is typically greater than or equal to 2.5 times the relaxation time. Examples of rotation rates vary from sample to sample. However, a sample having a relaxation time of 20 seconds could be continuously rotated at 1 rpm (17 mHz), while a sample with a relaxation time of 0.4 seconds could be continuously rotated at 1 Hz. Instead of continuous rotation, the sample could alternatively be rotated in a stepwise manner, allowing for rf irradiation and subsequent detection while the sample is stationary.

Coil 420 emits rf pulses defined by computer 350 to irradiate the sample material in holder 410. After the rf irradiation is complete, coil 420 is then used as an antenna to detect radio frequencies emitted by the sample. Typically, coil 420 can be a conventional solenoidal coil, but can also have other suitable designs, such as, for example, a Helmholtz ("saddle coil") design.

Instead of reorientating crystallites with respect to the external magnetic field $B_0$ by rotating a rigid sample, other rotation schemes are contemplated such as an isotropic motion that causes all points about the sample to be sampled with equal probability. Such motion could be created in a random fashion by placing sample material in a spherical container that can be reoriented randomly, by air jets, for example, thereby reorienting the sample inside. After the crystallites in the spherical container have been reoriented, a majority of the individual crystallites will have a different orientation when the container stops.

Figure 5:
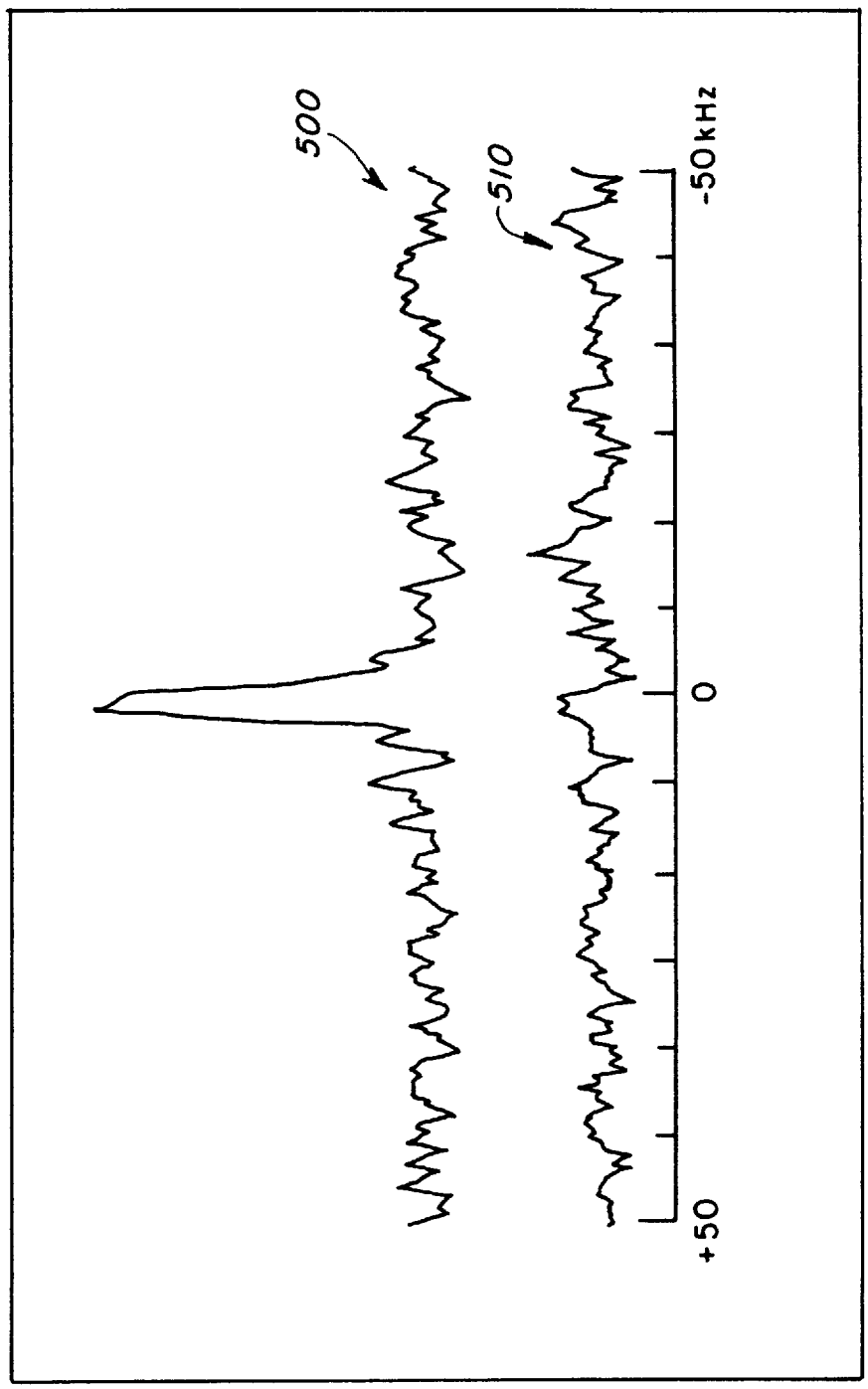
FIG. 5 illustrates a plot of an $^{14}$N NMR scan of potassium nitrate obtained by the present invention and a plot of a scan obtained of the same material by a conventional NMR spectrometer.

FIG. 5 illustrates $^{14}N$ NMR spectra of potassium nitrate ($KNO_3$) obtained from a sample rotated in accordance with the present invention (graph 500) and a stationary sample (graph 510). As clearly shown in FIG. 5, an absorption peak for a portion of the entire $^{14}N$ NMR spectrum of powered potassium nitrate generated in accordance with the present invention is readily discernible in trace 500, but not in trace 510, which is associated with the conventional stationary system. Thus, the present invention is particularly suited for solids containing $^{14}N$. The present invention is suitable for other elements that are conducive to NMR analysis.

In order to further improve NMR measurements taken in accordance with the present invention, a "spin-echo" technique can also be implemented, as described in greater detail below.

If the NMR process is viewed at the nuclear level from a rotating frame of reference which rotates at the Larmor frequency, a nuclear magnetic moment precessing around the main magnetic field $B_0$ at exactly the Larmor frequency appears to be stationary. In this frame of reference, the macroscopic magnetization M (the sum of the magnetic moments of all nuclei) is nominally aligned with the direction of the imposed magnetic field $B_0$.

If an rf pulse is applied for an appropriate time period, the macroscopic magnetization M is rotated 90° to become transverse, or perpendicular, to the magnetic field $B_0$. At this point, all of the magnetic moments that make up the macroscopic magnetization M are all in phase; that is, they are coherently tipped into the transverse plane. After the rf pulse is turned off, the magnetic moments begin to once again precess around magnetic field $B_0$, beginning in the transverse plane, and all in phase. However, the individual magnetic moments begin to diverge as some nuclei precess faster and some slower than the central Larmor frequency. Thus, there is a gradual "dephasing" of the different nuclear spins ("isochromats") and a consequent loss of phase coherence. When the magnetic moments are first tipped into the transverse plane by the rf pulse, a relatively strong signal or voltage is induced in the receiver coils by the magnetic moments. However, the signal gradually decreases due to energy exchange between spins (spin-spin relaxation time constant $T_2$) and the dephasing of the spins as described above, both of which are cumulatively characterized by relaxation time $T_2^*$. This signal is called the free induction decay (FID).

A "spin echo" or subsequent representation of the FID can be generated by bringing the spins of the magnetic moments back into phase coherence by another rf pulse. For example, if, at a time $\tau$ after the nuclear spins are tipped into the transverse plane or nutated (for example 90° with respect to the main magnetic field $B_0$) by a first rf pulse of appropriate frequency, magnitude, and duration (a 90° pulse), another electromagnetic signal of appropriate frequency, magnitude, and duration is applied to effect a 180° nutation of the nuclear spins (a 180° pulse), each individual spin is effectively rotated by 180° (in the rotating frame of reference). As a result of the 180° pulse, which may have the same phase as the first pulse, or may be of orthogonal phase, the phase is now the negative of the phase accumulated before the 180° pulse in the former case. The magnetic moments that had been precessing faster than the central Larmor frequency, and thus "ahead" of the other magnetic moments before the 180° pulse, are now "behind" the slower magnetic moments. As the faster magnetic moments "catch-up" to the slower magnetic moments, a stronger and stronger signal is induced in the receiver coil until the faster magnetic moments pass the slower ones and the signal begins to fade as the magnetic moments spread out. In this manner, a so-called "spin echo" of the FID is generated. The peak amplitude of the spin echo is dependent upon the transverse or spin-spin relaxation time constant $T_2$. The spin echo, in effect, comprises a mirror image and echo of the FID centered about a time $2\tau$ after the 90° pulse.

Another embodiment of the present invention uses not only the increased sensitivity described above, but also uses a new method of acquiring and analyzing data from a sample. The new method, named STEAMER for Slow Turning Echo Amplitude Modulation and Echo Reduction, uses information taken at at least one frequency, and possibly more, to obtain information about a broad NMR absorption spectrum. In a rotating sample, as in the first embodiment, the rate of change of the nucleus' resonance frequency during the rotation depends directly on the magnitude of "anisotropic inhomogeneous NMR interactions" that give an inhomogeneously-broadened NMR spectrum. In general, these are any interactions that cause the NMR resonance frequency to vary as a function of the orientation of a set of three orthogonal, molecule-fixed, axes with respect to the external magnetic field. At a given rotation rate, the broader the inhomogeneous NMR spectrum due to these interactions, the more rapidly the nuclei's resonance frequencies vary.

Figure 6:
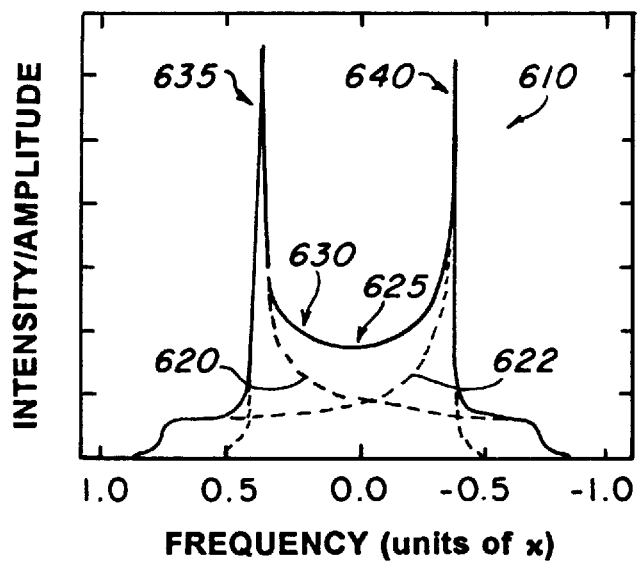
FIG. 6 is a theoretical NMR powder pattern for spin –1 nuclei experiencing a symmetric first-order nuclear electric quadrupole interaction.

The inhomogeneous broadening in the $^{14}$N NMR of $KNO_3$ arises from the nearly-axially-symmetric $^{14}$N nuclear electric quadrupole coupling tensor. FIG. 6 shows the theoretical NMR powder pattern 610 obtained from first-order perturbation theory for a nucleus such as $^{14}$N with I=1 and with an axially-symmetric nuclear electric quadrupole coupling tensor (asymmetry parameter $\eta$=0) associated with an electric field gradient (EFG) tensor. The spectrum consists of two mirror-image branches 620 and 622, one of which corresponds to the $0 \leftrightarrows +1$ transition and the other of which corresponds to the $0 \leftrightarrows -1$ transition. Each frequency position in a given branch corresponds to a unique cone angle the EFG tensor makes with respect to the static magnetic field axis; e.g., the most intense position, the so-called "horn" 635 and 640 corresponds to a perpendicular orientation of the tensor. Because the two branches overlap for one half of the spectrum, there are two such orientations present in this overlap region. Only at the center of the spectrum 625 are the two cone angles equal for the two branches (corresponding to the magic-angle of 54.7°). Since each branch of this quadrupole powder pattern is identical to an axially-symmetric chemical shielding anisotropy powder pattern, results can be determined for each branch separately as well as for the summed response. Thus, the calculations will also be applicable to cases involving an axially-symmetric chemical shift or Knight shift anisotropy or dipolar coupling of a nucleus to a thermally-averaged Curie moment of a single electron spin having an isotropic g-value.

The transition-selective nature of the rf pulses used to obtain wide-line $^{14}$N NMR spectra of powders at frequencies far removed from the center frequency are well known. In contrast to the non-selective pulses and quadrupole echo pulse sequence $[(\pi/2)_x - \tau - (\pi/2)_y - \tau - \text{observe}]$ typically used to obtain wide-line NMR spectra of $^2$H (I=1), the selective rf pulses employed in this method lead to a fictitious spin-1/2 behavior Thus, a fully-refocused echo signal at the carrier frequency is obtained from a conventional Hahn spin-echo pulse sequence $[(\pi/2)_x - \tau - (\pi)_{x \text{ or } y} - \tau - \text{observe}]$. The echo amplitude is reduced only by what can be considered to be $T_2$ processes arising from random motions modulating the spin Hamiltonian at the appropriate frequencies or from spin-spin interactions.

Figure 7:
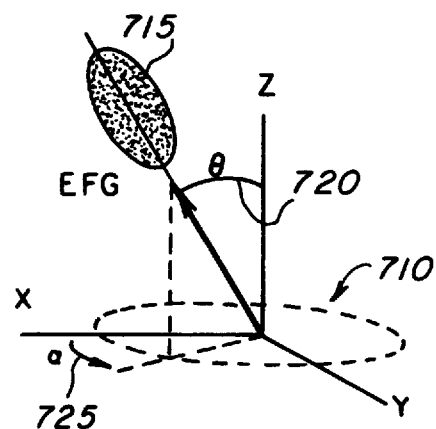
FIG. 7 illustrates the three dimensional axes in a static field coordinate system with the magnetic field along the z-axis and the orientation of the electric field gradient (EFG) tensor.
Figure 8:
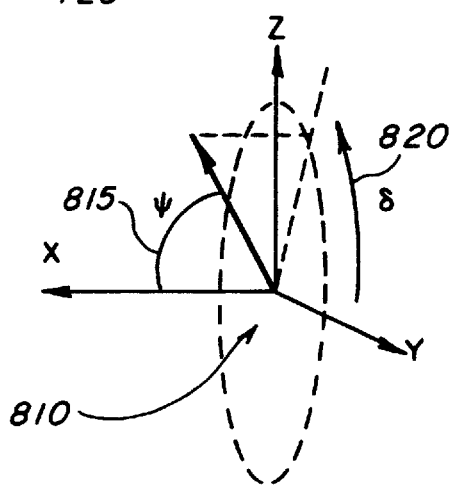
FIG. 8 illustrates the same three dimensional axes as FIG. 7 with polar and azimuthal angles defined with respect to rotation of the sample about the x-axis.

This embodiment, using equipment similar to that in FIG. 3 and 4, relies on the fact that the second rf pulse, the $\pi$ pulse, in a spin-echo pulse sequence, fails to properly refocus nuclear spins when their resonance frequencies become time-dependent under sample rotation. The time dependence of the nuclear resonance frequency $v(t)$ can be expressed for the specific cage of the first-order nuclear quadrupole interaction with I=1 and $\eta$=0 as follows:

$$v(t) = v_0 \pm \frac{3}{8} \chi (3\cos^2[\theta(t)] - 1) \qquad (2)$$

where $v_0$ is the nuclear Zeeman Larmor frequency in Hz, the $\pm$ symbol refers to the two possible interlevel transitions, $\chi$ is the NQCC value in Hz, and $\theta$ is the polar angle of the electric field gradient (EFG) tensor principal axis relative to the magnetic field (z) axis, which is made time dependent by sample rotation about the x axis. FIG. 7 shows the axis system 710 for the present embodiment in a static field coordinate system. The external magnetic field is along the z direction and the sample rotates around the x axis. The axially symmetric EFG tensor 715 is represented in FIG. 7 as an ellipsoid, having its principal axis defined by the polar angle θ 720 and azimuthal angle α 725. FIG. 8 illustrates the principal axis of the EFG in the sample rotation coordinate system 810, with the axis being defined by polar angle ψ 815 and azimuthal angle δ 820. It is important to note that the results derived here can be directly applied to the case of any axially-symmetric second-rank tensor and also generalized to rotation about an arbitrary axis.

The observed NMR signal originates from nuclei with resonance frequencies within a specific frequency region determined by the carrier frequency and the effective bandwidth of the radio frequency pulses. Hence these nuclei have EFG tensor principal axis orientations within a prescribed region of θ-space determined by Equation 2 above. For a specific θ orientation all azimuthal orientations α (from 0 to 2π, see 730 in FIG. 7) have indistinguishable NMR frequencies at time t=0, yet the influence of sample rotation on ν(t) for t>0 does depend on the α coordinate of a particular nucleus. For convenience the term "isochromat," referring to a collection of co-resonant nuclei, will be used here to refer to a set of nuclei having the same resonance frequency at time t=0 even though the range of α coordinates means that these nuclei will have frequencies which spread across the frequency domain for times t>0, The effect of sample rotation for a single nucleus with its EFG tensor principal axis described by angles $\theta_0 \equiv \theta(0)$ and $\alpha_0 \equiv \alpha(0)$ at time t=0 can be elucidated by a coordinate transformation of Equation 2 into a system of angles ψ and δ (see FIG. 8):

$$\nu(t) = \nu_0 \pm \frac{3}{8} \chi(3\sin^2(\psi)\sin^2[\delta(t)] - 1) \quad (3)$$

where ψ is constant and the time-dependent angle δ(t) is given by $\delta(t)=\delta(0)+\omega_r t$ for continuous rotation about the x-axis with an angular velocity $\omega_r$. The angles ψ and δ(0) can then be transformed back to the θ, α coordinate system in FIG. 7 using trigonometric identities to yield:

$$\nu(t) = \nu_0 \pm \frac{9}{8} \chi \left\{ \sin^2(\theta_0)\sin^2(\omega_r t)\sin^2(\alpha_0) + \cos^2(\theta_0)\cos^2(\omega_r t) + \right.$$
$$\left. 2\sin(\theta_0)\cos(\theta_0)\sin(\omega_r t)\cos(\omega_r t)\sin(\alpha_0) - \frac{1}{3} \right\}. \quad (4)$$

Note that in the limiting case of $\omega_r$=0 this equation simplifies to the usual time-independent first-order quadrupole interaction, as expected.

Equation 4 gives the resonance frequency as a function of time for nuclei with EFG tensors described by angles $\theta_0$ and $\alpha_0$ at time t=0 under the condition of continuous rotation about the x axis. This equation can be used to predict the influence of sample rotation on spin-echo formation by considering the phase angle (relative, to an axis in a reference frame rotating at the rf carrier frequency) accumulated by isochromats during the course of the Hahn spin-echo sequence:

$$\Delta\Phi(\tau,\tau') = \int_0^\tau [\nu(t) - \nu_{rf}]dt - \int_\tau^{\tau'} [\nu(t) - \nu_{rf}]dt \quad (5)$$

where τ is the delay between the π/2 pulse at t=0 and the π pulse, $\nu_{rf}$ is the rf carrier frequency, and ΔΦ is the accumulated phase at time τ' (≧τ) in units of cycles. This calculation assumes that the nuclei are irradiated with pulses that provide perfect π/2 and π rotations. Such an assumption requires that the experimental sample rotation rate be sufficiently slow so that the resonance frequencies given by Equation 4 do not change enough during the sequence to render the π pulse ineffective. Equation 5 can be evaluated for the case in which ν(t) is given by Equation 4, yielding:

$$\Delta\Phi(\tau,\tau') = \left( \nu_0 \pm \frac{3}{8} \chi[3\cos^2(\theta_0) - 1] - \nu_{rf} \right)(2\tau - \tau')\pm \quad (6)$$
$$\frac{9}{32} \frac{\chi}{\omega} \{2\omega_r[\sin^2(\theta_0)\sin^2(\alpha_0) - \cos^2(\theta_0)](2\tau - \tau') - $$
$$\sin(2\theta_0)\sin(\alpha_0)[2\cos(2\omega_r\tau) - \cos(2\omega_r\tau') - 1] - $$
$$[\sin^2(\theta_0)\sin^2(\alpha_0) - \cos^2(\theta_0)][2\sin(2\omega_r\tau) - \sin(2\omega_r\tau')]\}.$$

Equation 6 is used to calculate the spin-echo amplitude or intensity at time τ'=2τ as a function of the echo time τ for comparison to the $^{14}$N NMR results. The equation can also be used to calculate time-domain signals as a function of τ' that can be Fourier-transformed to reveal the influence of the rotation of the sample (the STEAMER effect) on the NMR lineshape at a given τ value. Similarly, Equation 6 can be used to calculate free-induction decays during sample rotation by setting τ=0.

The echo time is generally much shorter than the sample rotation period (i.e. $\omega_r\tau \leq \omega_r\tau' >> 1$), enabling Equation 6 to be well-represented by the approximation:

$$\Delta\Phi_{s.t.}(\tau,\tau') = \left\{ \nu_0 \pm \frac{3}{8} \chi[3\cos^2(\theta_0) - 1] - \nu_{rf} \right\} (2\tau - \tau') \pm \quad (7)$$
$$\frac{9}{16} \chi\omega_r \left\{ \sin(2\theta_0)\sin(\alpha_0)(2\tau^2 - \tau'^2) + \right.$$
$$\left. \frac{2}{3} \omega_r[\sin^2(\theta_0)\sin^2(\alpha_0) - \cos^2(\theta_0)](2\tau^3 - \tau'^3) \right\}$$

where the subscript s.t. indicates the short-time approximation. Equation 7 clearly shows that for $\omega_r$=0 all participating isochromats will have an accumulated phase value of $\Delta\Phi_{s.t.}$=0 at a time τ'=2τ, as expected for the stationary spin echo. In contrast, for $\omega_r$>0 the values of $|\Delta\Phi_{s.t.}(\tau,2\tau)|$ increase as a function of $\tau^2$ and $\tau^3$ and depend strongly upon the initial EFO tensor principal axis orientations of the participating isochromats. The result of this dispersion of accumulated phase angles is a loss of refocusing and a reduction in the spin echo intensity due to sample rotation.

It is important to consider the symmetry of the angular terms in Equations 6 and 7. We need only calculate the behavior of EFG tensors having $\theta_0$ values in the range of 0 to θ/2 (because for all τ and τ',$\Delta\Phi(\theta_0,\alpha_0)=\Delta\Phi(\pi-\theta_0,-\alpha_0)$) and $\alpha_0$ values ranging from −π/2 to +π/2 (because $\Delta\Phi(\theta_0,\alpha_0)=\Delta\Phi(\theta_0,\pi-\alpha_0)$). These symmetries reduce the $\theta_0,\alpha_0$ grid used for simulations by a factor of ¼.

Furthermore, it can be shown from Equation 7 that if the inequality:

$$\omega_r\tau \leq \omega_r\tau' >> |\sin(2\theta_0)\sin(\alpha_0)| \quad (8)$$

is satisfied, then the short-time approximation is dominated by the $\tau^2$ term and the $\tau^3$ term can be dropped. The result, is the quadratic short-time approximation:

$$\Delta\Phi_q(\tau,\tau') = \left\{ \nu_0 \pm \frac{3}{8} \chi[3\cos^2(\theta_0) - 1] - \nu_{rf} \right\} (2\tau - \tau') \pm \quad (9)$$
$$\frac{9}{16} \chi\omega_r\sin(2\theta_0)\sin(\alpha_0)(2\tau^2 - \tau'^2),$$

which can be quite useful for describing the behavior of frequency regions not unreasonably close to the perpendicular or parallel edges of the powder pattern (i.e. considering Equation 8).

Both terms in Equation 9 cause isochromat dephasing under rotation and have fundamentally different dependencies on the time variables $\tau$ and $\tau'$. The second term in Equation 9, perturbs the perfect refocusing at time $\tau'=2\tau$ that is associated with the first term. Alternatively, it should be noted that a reverse picture applies to isochromats in a frequency region very near the rf carrier frequency at times $\tau'<2\tau$. For such isochromats the first term will contribute little dephasing for sufficiently short $\tau$ values, yet the second term can contribute significant dephasing if $\omega_r$ is sufficiently large. Hence, the first term could then be thought of as a perturbation of the perfect refocusing associated with the second term at a time $\tau'=\sqrt{2}\tau$.

Figure 9:
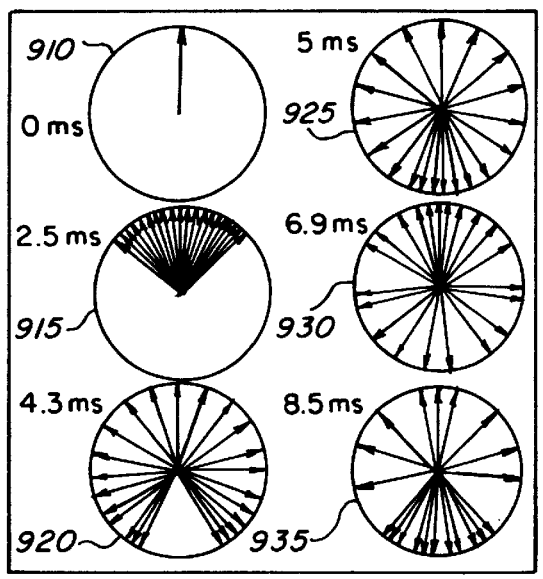
FIG. 9 illustrates the dephasing of the nuclear spins in an x-y plane under slow rotation in a magnetic field at six different echo times.

Some insight into the refocusing occurring under slow turning conditions can be gained by considering that within the quadratic short-time approximation $\Delta\Phi_q(\theta_0,\alpha_0)=-\Delta\Phi_q(\theta_0,-\alpha_0)$, and noting that for every nucleus with an EFG tensor having a principal axis direction $(\theta_0,+\alpha_0)$, there will be another nucleus whose EFG tensor has a principal axis direction $(\theta_0,-\alpha_0)$. The corresponding pairs of isochromats will have equal and opposite $\Delta\Phi_q$ values, leading to a reduced or even inverted magnetization directed along the original detection axis. The origin of this amplitude modulation can be seen in FIG. 9, which shows the behavior for different $2\tau$ values of 25 isochromats having the same $\theta$ value of 45° but different $\alpha_0$, values spaced evenly from $-\pi/2$ to $+\pi/2$, as calculated from Equation 6. See also FIG. 7. The calculations of dephasing of the isochromats were done using the simulation parameter values of $\chi=751$ kHz, $\eta=0$, and $\omega_r=0.105$ rad/s (1 rpm), which were chosen to closely approximate the $^{14}$N NMR spin-echo experiments described below in the example. The diagrams in FIG. 9 show calculated isochromat orientations in the x-y plane at varying times $\tau'=2\tau$. The spin-echo amplitude, corresponding to the projection of the vector sum of the isochromat magnetizations onto the detection axis at time $2\tau$, starts at a maximum at $2\tau=0$, 910 in FIG. 9. At later times, the spin-echo amplitude decreases ($2\tau=2.5$ ms, 915), then passes through zero ($2\tau 4.3$ ms, 920), becomes negative ($2\tau=5$ ms, 925), and continues to be modulated, 930 and 935, and eventually damped out at longer echo times.

Figure 10:
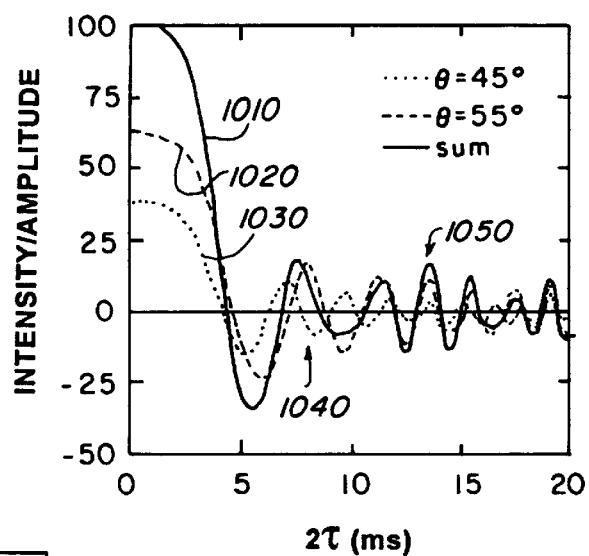
FIG. 10 illustrates a numerical simulation of $^{14}$N NMR spin-echo amplitudes in accordance with the present invention.

This type of decaying modulatory behavior can be seen in the simulation results in FIG. 10, where the echo amplitude/intensity is plotted versus the echo time $2\tau$. The curves are a numerical simulation making use of Equation 6 to obtain the summed response of echo signals for nuclei within a 5 kHz region centered at +130.2 kHz from the middle of an I=1, $\eta=0$ first-order quadrupolar powder pattern with $\chi=751$ kHz. Again, the sample rotation rate is 1 rpm. The center frequency (+130.2 kHz) corresponds to values of $\theta_0=45°$ and $\theta_0=66°$ for the two nuclear transitions $0\leftrightarrows\pm$at the position of the arrow 630 in FIG. 6. This region of the powder pattern 610 was chosen for investigation because of the relatively rapid impact of rotation on the spin-echo intensity/amplitude. A square radio frequency excitation profile was selected for simplicity in these simulations. The regions of $\theta_0$-space (as determined by Equation 2 for $\nu(0)$ =130.2±2.5 klz) and $\alpha_0$-space for each transition were divided into a mesh of $\theta_0$ and $\alpha_0$ coordinates with the real-estate weighting appropriate to a powder sample (i.e. the mesh points have a uniform surface density on the unit sphere). Each mesh point represents an isochromat composed of nuclei having EFG principal axis directions specified by the angles $\theta_0$, $\alpha_0$. Echo amplitudes as a function of the total echo interval $2\tau$ from the 66° region (162,830 isochromats) and the 45° region (98,694 isochromats) are plotted separately as 1020 and 1030, respectively, in FIG. 10.

The numerically simulated curves in FIG. 10 have been scaled such that their sum equals 100 at $2\theta=0$, 1010. Note that the curve for the 45°region 1030 oscillates more rapidly than that for the 66° region 1020, as expected from Equation 9. Moreover, the appearance of the sum 1010 of the two curves 1020 and 1030 shows that the signals from the two transitions can interfere both destructively 1040 and constructively 1050.

We can also obtain an analytical representation that can simplify the data analysis in some cases. The quadratic short-time approximation of Equation 9, subject to the constraint defined by Equation 8, can be integrated over the azimuthal angle $\alpha_0$ to obtain the time-domain NMR signal stemming from a region defined by a single polar angle $\theta_0$:

$$S_q(\tau,\tau') = \sin(\theta_0) \int_{-\pi/2}^{+\pi/2} \cos[2\pi \cdot \Delta\Phi_q(\tau,\tau')]d\alpha_0 \tag{10}$$

where $S_q$ is the signal intensity and the real-estate factor $\sin(\theta_0)$ is included for comparing the intensities coming from different frequencies (i.e. polar angles $\theta_0$). The integral in Equation 10 yields the analytical expression:

$$S_q(\tau,\tau') = \pi\sin(\theta_0) \cdot \tag{11}$$
$$\cos\left\{2\pi\left[\nu_0 \pm \frac{3}{8}\chi[3\cos^2(\theta_0)-1]-\nu_{rf}\right](2\tau-\tau')\right\} \cdot$$
$$J_0\left[\frac{9}{8}\pi\chi\omega_r\sin(2\theta_0)(2\tau-\tau')\right]$$

where $J_0$ is the Bessel function of order zero. Equation 11 can be numerically integrated over the appropriate $\theta_0$ region to generate STEAMER curves, such as 1010, 1020, and 1030, in FIG. 10, or used directly (without integration) when the function $\sin(2_0)$ is approximately the same for all observed spins. For a given observation bandwidth this condition is more likely to be met at powder-pattern regions where: (1) $\theta_0$ changes relatively slowly with respect to the resonance frequency, equivalent to demanding that the slope of Equation 2 be large, and (2) the function $\sin(2\theta_0)$ changes relatively slowly with respect to $\theta_0$, equivalent to demanding that the curvature of Equation 2 be small. Both requirements suggest that powder-pattern regions near $\theta_0=45°$ will be more likely to be adequately described by Equation 11 without further integration.

Figure 11:
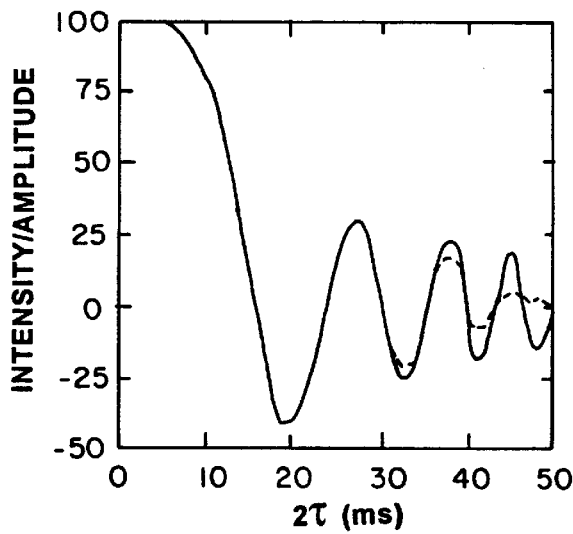
FIG. 11 illustrates theoretical intensities of signals according to the present invention.

A comparison of results calculated using the different expressions above for the STEAMER signal is shown in FIG. 11. A single $\theta_0$ value of 88° was chosen. The numerical simulations obtained by means of Equation 6 and Equation 7 precisely overlay each other as expected and thus appear as a single line 1110 because the short-time approximation is well-satisfied. The analytical solution, curve 1115, from Equation 11 agrees quite well with the other curves out to a $2\tau$ value of about 35 ms. This agreement indicates that the angular restriction imposed by Equation 8 is still reasonably well-satisfied at a $\theta_0$ value of 88° and that the quadratic short-time approximation of Equations 9 and 11 may be used across most of the powder pattern.

It is also possible to use a graphical method for determining $\chi$ by considering the case of $\tau'=2\tau$ in Equation 11:

$$S_q(\tau,2\tau) \propto J_0\left[\frac{9}{4}\pi\chi\omega_r\sin(2\theta_0)\tau^2\right] \tag{12}$$

which indicates that the first node (zero-crossing) of $S_q$, determined by $J_0(2.41)=0$, is a function of $\chi$, both directly and indirectly via the dependence of $\theta_0$ on $\chi$. Setting the argument of the Bessel function in Equation 12 to the value 2.41 leads one to define the function:

$$f(\chi) = 2.41 \cdot \frac{4}{9\pi\omega_r \tau_{zero}^2} - \chi \cdot$$

$$\sin\left\{2 \cdot \cos^{-1}\left[\left(\frac{1}{3} \pm \frac{8}{9}(\nu_{rf} - \nu_0)\chi^{-1}\right)^{1/2}\right]\right\} \quad (13)$$

where $2\tau_{zero}$ is the experimentally determined first node of a STEAMER data set. The zero-crossing of this function $f(\chi)$ can then be used to determine $\chi$. It should be noted that Equation 13 can be applied to experimental data only under the following three conditions: (1) the quadratic short-time approximation is satisfied, (2) the region of observed $\theta_0$-space is narrow enough to make integration over $\theta_0$ unnecessary, and (3) the STEAMER data are either dominated by a single transition (e.g. for a CSA powder pattern) or the $\tau$-dependence of both transitions is similar (as is the case near the center of the I=1 powder pattern).

It should be emphasized that the signal-to-noise ratio of the STEAMER data is significantly improved vis-á-vis the static data obtained with a comparable signal accumulation period. This sensitivity improvement, described above, relies on the fact that sample rotation carries unsaturated spins into the observed frequency region at a rate significantly faster than the recovery of saturated spins due to spin-lattice relaxation processes. The $^{14}$N spin-lattice relaxation time $T_1$ was determined by transition-selective saturation recovery measurements at the high-frequency "horn" to be 40 s in $KNO_3$. Sample rotation thus providently allows more rapid pulsing in the STEAMER embodiment than in a static $T_2$ embodiment.

The effect from the first embodiment can also potentially complicate the interpretation of results in this embodiment by introducing another form of $\theta_0$, $\alpha_0$, dependence to the observed signal, i.e. dependencies that arise from saturation effects. This may be particularly problematic when two simultaneously observed transitions have markedly different $\theta_0$ values. For example, at the "horn" region (see 635 and 640 in FIG. 6) the high-intensity Position ($\theta_0=90°$) is much more prone to saturation under sample rotation than the low-intensity transition ($\theta_0=35°$), making the above analysis difficult to apply directly. Such complications can of course be avoided by using a sufficiently long recycle delay to prevent saturation. This, however, diminishes the acquisition efficiency gained by sample rotation. Therefore, results from the first embodiment can be used to choose conditions such that these complications can be reasonably ignored (as done here) or to develop simulations that would incorporate effects from both embodiments. For example, recycle delay times which divide evenly into integer multiples of half the rotation period should be avoided, since they can cause unnecessary saturation (for example 7.5 s=30 s/4 would be an inadvisable recycle delay for experiments at 1 rpm). In the present case a recycle delay of 5.3 s was determined to be long enough to avoid significant saturation by successive pulses yet sufficiently less than $T_1$ to yield a significant sensitivity advantage relative to the static case.

The accuracy of the NQCC determination is limited by the $^{14}$N signal-to-noise ratio, although other factors such as any non-uniformity in the rotation rate $\omega_r$ may also contribute. For example, in determining an axially-symmetric tensor, the sample turning rate and the rf carrier frequency from the assumed center are known with good accuracy, and thus the only unknown is $\chi$ itself. The linear $\chi$-dependence of the rotation-dependent term in Equation 7 might indicate at first glance that one could calculate a "universal" STEAMER curve with changes in $\chi$ merely resulting in a scaling of the time axis (as would be the case for changes in $\omega_r$ when $T_2$ effects are neglected). This is not the case, however, since $\chi$ also determines the $\theta_0$ values used in Equation 6 for a given $\nu_{rf}$ value. In the case of $KNO_3$, for example, calculations using a coupling constant smaller 751 kHz would demand the use of an angle larger than 66° for the high-intensity branch and an angle less than 45° for the low-intensity branch. The calculated STEAMER curves in such a case, similar to the dashed and dotted curves 1020 and 1030, respectively, in FIG. 10, would oscillate more slowly and would lead to a different beat structure in the summed curve 1010 at longer echo times. In general, a good signal-to-noise ratio and a long value for the static $T_2$ enable detailed measurements of this beat structure and thus allow more accurate determinations of $\chi$.

Shorter $T_2$ values can in principle be overcome by turning the sample more rapidly, causing the STEAMER oscillations to occur on a shorter time scale. Indeed, this point suggests an alternative approach in which one holds the spin-echo time $2\tau$ constant and varies $\omega_r$ to map out the STEAMER curve. The rotation rate, however, must not be made so fast as to allow a significant fraction of the isochromats to migrate outside of the excitation bandwidth of the refocusing $\pi$ pulse. Moreover, data taken with multiple $\omega_r$ values could lead to intensity variations due to the differing saturation effects noted above for the first embodiment that would complicate the interpretation of the data. Even considering these potential difficulties, this alternative approach may prove useful in a case where the $T_2$ decay times depend strongly upon the angle $\theta_0$. In such cases one cannot simply apply a single-exponential decay function to the simulated STEAMER curve (obtained by varying the echo time $2\tau$) because the STEAMER curve for each transition will decay at a different rate. In an experiment employing a fixed $2\tau$ value with multiple $\omega_r$ values the differing $T_2$ decay times simply scale the intensities of the STEAMER curve for each transition differently. Although this would require one additional fit parameter, it would obviate the need for a time-consuming static $T_2$ measurement. Moreover, a short enough $2\tau$ value would allow any $T_2$ effects to be neglected altogether in experiments employing variable $\omega_r$ values.

It is also possible to incorporate the decay time $T_2$ into the data analysis as a fitting parameter. This approach is reasonable given that a single-exponential decay envelope has no impact on the zero-crossings of a STEAMER curve. Simulated zero-crossings could be matched to experimental zero-crossings without any initial consideration of $T_2$, and a $T_2$ value could be determined subsequently by matching experimental and simulated signal amplitudes. This approach takes full advantage of the first embodiment's effect by precluding the need to measure $T_2$ without sample rotation.

When the NQCC is not known a priori, it is possible to make a reasonable first guess at the NQCC value $\chi$, carry out the numerical simulation, compare it to the data, and iterate this process until satisfactory results are obtained.

Figure 13:
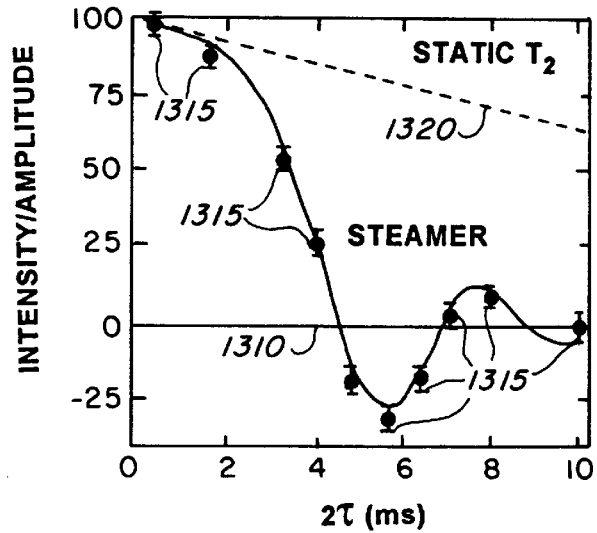
FIG. 13 illustrates a $^{14}$N NMR peak height versus the spin-echo time 2τ in a rotating sample of $KNO_3$ in accordance with the present invention.
Figure 14:
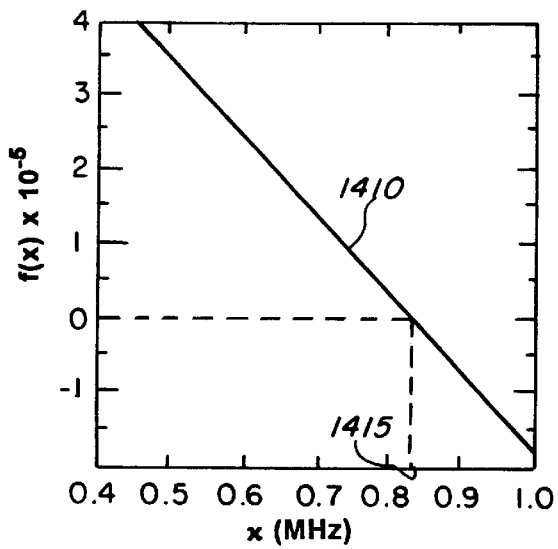
FIG. 14 illustrates graphically measuring the NQCC parameter χ associated with an axially-symmetric EFG tensor in accordance with the present invention.

A more straightforward approach is to apply the graphical method, alluded to above and shown in FIG. 14. The first node 1310 of the STEAMER data 1315 in FIG. 13 was determined to be $2\tau_{zero}$=4.5 ms by linear interpolation of the adjacent data points 1315, and the $f(\chi)$ curve 1410 generated by Equation 13 is shown in FIG. 14. The resulting coupling constant value 1415 can be read directly from the graph as 826 kHz, which is 10% larger than the actual value. This discrepancy is not surprising because the third criterion for using Equation 13, that the STEAMER data be dominated by a single nuclear transition or that the transitions have similar τ-dependencies, is not strictly satisfied (see curves 1020 and 1030 in FIG. 10). A (−)sign was assumed in Equation 13, equivalent to assuming that all of the signal comes from the 66° region (represented by curve 1020 in FIG. 10) of the powder pattern 610. The contribution of the 45° region (represented by curve 1030) in FIG. 10, pulls the value of $\tau_{zero}$ to shorter times and thus makes the determined $\chi$ value too large. Experiments performed closer to the powder pattern center 625 can be expected to give more accurate results. It is worth noting that all three criteria for using Equation 13 are likely to be met near the center 625 of the powder pattern 610.

It should be emphasized that the above graphical method based on locating the first null-time point $\tau_{zero}$ 1310 has several significant advantages. The static $T_2$ value need not be measured when only the value of $\tau_{zero}$ 1310 is required, and any dependence of $T_2$ upon $\theta_0$ has no impact as long as the criteria for using the graphical method (FIG. 14) are met. Moreover, saturation effects due to sample rotation can also be neglected in applications of this method.

In general these calculations need to be extended in order to account for non-zero values of the asymmetry parameter η. It is feasible to use two-dimensional data sets (frequency domain vs. echo time or its Fourier transform), and a determination of both η and $\chi$ via nomographic or other fitting methods may be possible.

EXAMPLE

Experiments were carried out at 7.05 T on a Bruker MSL-300 spectrometer operating at a $^{14}$N Larmor frequency centered at 21.682 MHz. A high-power probe was modified to permit slow turning of a 10 mm O.D. sample tube about an axis perpendicular to the static magnetic field. Smooth (non-jerky) sample rotation helps meet the condition of a well-defined $\omega_r$ value during the entire NMR acquisition. The $^{14}$N NQCC of 751 kHz and asymmetry parameter η=0.022 (rather than zero as used in the equations above) measured for $KNO_3$ are very close to the parameters used above. A selective π/2 pulse length of 9.2 μs was calculated from the nonselective pulse width measured at the central Larmor frequency of 21.682 MHz for the $^{14}$N resonance of a small amount of ammonium chloride admixed with the $KNO_3$. The rf carrier frequency was set to and the probe retuned to 21.821 MHz in order to irradiate the 45° and 66° regions of the powder pattern; this choice of frequency takes into account the $^{14}$N isotropic chemical shift difference between $KNO_3$ and the sharp $^{14}$N ammonium resonance in ammonium chloride used to define the $^{14}$N Larmor frequency in the unlocked static magnetic field. A 16-step phase cycle having all possible permutations of the phases for the π/2 and π pulses was used.

Figure 12:
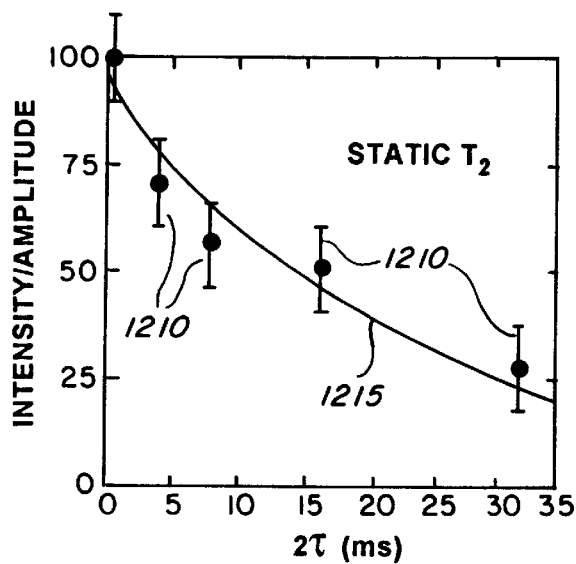
FIG. 12 illustrates a $^{14}$N NMR peak height versus the spin-echo time 2τ in a static sample of $KNO_3$.

FIG. 12 shows $^{14}$N spin-echo data 1210 for $KNO_3$ under static (non-rotating) conditions. A transverse relaxation time $T_2$ of 23±5 ms was determined from a single-exponential fit to this data, line 1215. Echo amplitudes were obtained by Fourier transforming the right half of the spin-echo signal apodized with an exponential decay corresponding to a 5 kHz line broadening and measuring the center frequency intensity. These data 1210 indicate that the static $T_2$ value 1215 is significantly longer than the time scale of STEAMER effects predicted in FIG. 10.

FIG. 13 shows the $^{14}$N STEAMER data 1315 for $KNO_3$ with a sample rotation rate of 1 rpm. These data points 1315 were obtained by Fourier transforming the right half of the spin-echo after 5 kHz line broadening and measuring the center frequency intensity. The center of the echo was determined by locating the maximum in the magnitude of the time-domain signal and was in close agreement (within the dwell time of 4 μs) with that expected for a Hahn spin echo taking into account pulse widths and delays. The solid curve 1310 in FIG. 13 is the numerically simulated response for the sum of both transitions 1020 and 1030 shown in FIG. 10 after multiplication by a decaying exponential of 23 ms to account for the effect of the intrinsic $^{14}$N transverse relaxation. The dashed line 1320 in FIG. 13 shows that this static $T_2$ contribution has a minimal impact on the STEAMER data 1315 for this range of 2τ values out to 10 ms. In effect, both the theoretical and experimental intensities correspond to the summed responses from a region of the powder pattern that is approximately 5 kHz wide; this region is sharply defined in the theoretical case and is defined by a 5 kHz full-width at half-maximum Lorentzian distribution in the experimental case. Contributions from the second-order nuclear quadrupolar interaction[12] (ca. 2 kHz) or $^{14}$N chemical shift anisotropy (ca. 4 kHz) were ignored. The experimental STEAMER data are in very close agreement with the simulated curve, which was obtained without any adjustable parameters (other than normalization).

In addition to advantages described above, the present invention can be simply retrofitted onto conventional NMR probes, and requires minimal or no change in the radio frequency electronics.

It will be apparent to those skilled in the art that various modifications and variations can be made in the present invention and in the construction of this invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for analyzing a solid sample using nuclear magnetic resonance, said apparatus comprising:
    a source for generating a magnetic field;
    a support member holding said solid sample in said magnetic field; and
    a drive mechanism for rotating said support member at a period T, said period being equal to or greater than a nuclear spin-lattice relaxation time of nuclei of atoms in said sample.

2. An apparatus in accordance with claim 1, wherein said drive mechanism rotates said support member continuously.

3. An apparatus in accordance with claim 1, wherein said drive mechanism rotates said support member in a stepped manner.

4. An apparatus in accordance with claim 1, wherein nuclei of said atoms resonate over a first range of frequencies Δf1, said apparatus further comprising:
    a pulse generator supplying a plurality of pulse sequences, the pulse sequence having at least one pulse of electromagnetic radiation effective over a second range of frequencies Δf2, each of said plurality of pulse sequences being spaced by an interval D satisfying:

$$D \simeq \frac{\Delta f2 \times T}{\Delta f1}$$

5. An apparatus in accordance with claim 1, wherein said drive mechanism further comprises:

a motor; and a gear assembly coupling said motor to said support member.

6. A nuclear magnetic resonance spectrometer for analyzing a solid sample, comprising:
   a magnet for generating a magnetic field;
   a motor coupled to rotate said solid sample; and
   a control circuit coupled to said motor to regulate a speed of said motor such that said sample is rotated with a period T that is equal to or greater than a nuclear spin-lattice relaxation time of nuclei of atoms of an element in said solid sample.

7. A nuclear magnetic resonance spectrometer in accordance with claim 6, wherein nuclei of said atoms resonate over a first range of frequencies $\Delta f1$, said nuclear magnetic resonance spectrometer further comprising:
   a conductive coil disposed in said magnetic field and surrounding said solid sample;
   a current source coupled to energize said conductive coil, such as to generate a plurality of pulse sequences, the pulse sequence having at least one pulse of electromagnetic radiation over a second frequency range $\Delta f2$, said plurality of pulse sequences being spaced by a delay D satisfying;

$$D \cong \frac{\Delta f2 \times T}{\Delta f1}$$

8. A nuclear magnetic resonance spectrometer in accordance with claim 6, further comprising:
   a support member holding said sample; and
   a gear assembly coupling said motor to said support member.

9. A method for measuring an NMR spectrum of a solid sample, said solid sample including a plurality of atoms having a nuclear spin-lattice relaxation time, said method comprising the steps of:
   generating a magnetic field;
   placing said solid sample in the magnetic field;
   rotating said solid sample with a period T greater than said spin-lattice relaxation time;
   subjecting said rotating solid sample to a plurality of pulse sequences, each of the plurality of pulse sequences having at least one rf pulse;
   detecting electromagnetic radiation emitted from said rotating solid sample in response to said plurality of pulse sequences.

10. A method in accordance with claim 9, wherein said rotating step further comprises the step of rotating said sample continuously.

11. A method in accordance with claim 9, wherein said rotating step further comprises the step of rotating said sample in a stepped manner.

12. A method in accordance with claim 9, wherein T is equal to or greater than 2.5 times said spin-lattice relaxation time.

13. A method in accordance with claim 9, wherein nuclei of said atoms resonate over a range of frequencies $\Delta f1$, said subjecting step further comprises the steps of:
   generating a plurality of pulse sequences, each of the plurality pulse sequences having at least one pulse of electromagnetic radiation having a range of frequencies $\Delta f2$; and
   delaying successive ones of said plurality of pulse sequences by a duration D satisfying:

$$D \cong \frac{\Delta f2 \times T}{\Delta f1}$$

14. A method for determining at least one orientation dependent NMR parameter in a solid sample comprising the steps of:
   (a) placing a sample in a magnetic field, the magnetic field having a first axis;
   (b) turning the sample in the magnetic field around a second axis at a rotation rate T, the second axis being different from the first axis;
   (c) irradiating the rotating sample with a plurality of pulse sequences, each of the pulse sequences having a least two rf pulses separated by a time $\tau$;
   (d) collecting a signal from the sample in response to the pulse sequence;
   (e) repeating steps (c) and (d); and
   (f) calculating the at least one orientation dependent NMR parameter from the collected signals, wherein time $\tau$ is varied in each pulse sequence and the period T remains constant, or wherein the period T is varied and the time $\tau$ remains constant.

15. The method of claim 14 wherein time $\tau$ is varied in each pulse sequence and the period T remains constant.

16. The method of claim 14 wherein period T is varied in each pulse sequence and the time $\tau$ remains constant.

17. The method of claim 14 wherein the step of calculating the at least one orientation dependent NMR parameter comprises the substeps of:
   calculating an amplitude of each of the collected signals as a function of the pulse sequence; and
   plotting the calculated amplitudes and determining from the plot the time $\tau_{zero}$, $\tau_{zero}$ corresponding to a first occurrence of the signal amplitude being zero.

18. The method of claim 17 wherein the amplitude is calculated as a time domain signal.

19. The method of claim 17 wherein the amplitude is calculated as a frequency domain signal.

20. The method of claim 17 further comprising the step of using $\tau_{zero}$ to determine from a graph the at least one orientation dependent NMR parameter, the at least one orientation dependent NMR parameter being the NQCC value of the sample and the graph corresponding to the following equation:

$$f(\chi) = 2.41 \cdot \frac{4}{9\pi\omega_r\tau_{zero}^2} - \chi \cdot$$

$$\sin\left\{2 \cdot \cos^{-1}\left[\left(\frac{1}{3} \pm \frac{8}{9}(v_{rf} - v_0)\chi^{-1}\right)^{1/2}\right]\right\},$$

where $v_{rf}$ is the rf pulse frequency, $v_0$ is the nuclear Zeeman Larmor frequency, $\chi$ is the NQCC in Hz, $\omega_r$ is the angular velocity.

21. The method of claim 14, wherein said sample is rotated with a period greater than or equal to the nuclear spin-lattice relaxation time.

* * * * *